(12) United States Patent
Wang et al.

(10) Patent No.: US 12,727,305 B2
(45) Date of Patent: Sep. 1, 2026

(54) DISPLAY PANEL AND METHOD FOR MANUFACTURING THE SAME, DISPLAY DEVICE, AND TILED DISPLAY DEVICE

(71) Applicants: BOE MLED Technology Co., Ltd., Beijing (CN); BOE TECHNOLOGY GROUP CO., LTD., Beijing (CN)

(72) Inventors: Lili Wang, Beijing (CN); Sha Feng, Beijing (CN); Chao Liu, Beijing (CN); Jing Wang, Beijing (CN); Mingming Jia, Beijing (CN); Chuhang Wang, Beijing (CN); Qi Qi, Beijing (CN)

(73) Assignees: BOE MLED TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 514 days.

(21) Appl. No.: 18/262,828

(22) PCT Filed: Jul. 4, 2022

(86) PCT No.: PCT/CN2022/103713
§ 371 (c)(1),
(2) Date: Jul. 25, 2023

(87) PCT Pub. No.: WO2023/005618
PCT Pub. Date: Feb. 2, 2023

(65) Prior Publication Data

US 2024/0097085 A1 Mar. 21, 2024

(30) Foreign Application Priority Data

Jul. 29, 2021 (CN) ......................... 202110865116.1

(51) Int. Cl.
*H10H 20/856* (2025.01)
*H10D 86/00* (2025.01)
(Continued)

(52) U.S. Cl.
CPC .......... *H10H 20/856* (2025.01); *H10W 90/00* (2026.01); *H10H 20/0363* (2025.01)

(58) Field of Classification Search
CPC .... H10H 20/856; H10H 20/857; H10H 29/10; H10H 20/0364; G09F 9/30; H10D 86/01
See application file for complete search history.

(56) References Cited

U.S. PATENT DOCUMENTS

2014/0363624 A1 12/2014 Bareman et al.
2016/0368101 A1 12/2016 Hsieh et al.
(Continued)

FOREIGN PATENT DOCUMENTS

CN 104439720 A 3/2015
CN 106932944 A 7/2017
(Continued)

*Primary Examiner* — Antonio B Crite
(74) *Attorney, Agent, or Firm* — XSENSUS LLP

(57) ABSTRACT

A display panel (10) includes a circuit backplane (1) and a reflective layer (3). The circuit backplane (1) includes a first main surface (11), a second main surface (12), and a plurality of side surfaces (13). The second main surface (12) is disposed opposite to the first main surface (11). The side surfaces (13) each connect the first main surface (11) and the second main surface (12). At least one side surface in the plurality of side surfaces (13) is a selected side surface (**13*a*). The selected side surface (13*a*) is covered by the reflective layer (3), the reflective layer (3**) being configured to be removed under a predetermined process condition.

19 Claims, 14 Drawing Sheets

(51) Int. Cl.

| | |
|---|---|
| ***H10D 86/01*** | (2026.01) |
| ***H10H 20/01*** | (2025.01) |
| ***H10H 20/855*** | (2025.01) |
| ***H10H 20/857*** | (2025.01) |
| ***H10W 42/00*** | (2026.01) |
| ***H10W 74/10*** | (2026.01) |
| ***H10W 90/00*** | (2026.01) |

(56) References Cited

U.S. PATENT DOCUMENTS

| | | | | |
|---|---|---|---|---|
| 2017/0338297 | A1 | 11/2017 | Li et al. | |
| 2018/0240950 | A1 | 8/2018 | Jang et al. | |
| 2021/0200006 | A1* | 7/2021 | Ryu | G02F 1/13452 |
| 2021/0362467 | A1 | 11/2021 | Liu et al. | |
| 2021/0399185 | A1 | 12/2021 | Liu et al. | |
| 2022/0302362 | A1 | 9/2022 | Gong et al. | |
| 2024/0304773 | A1* | 9/2024 | Oh | H10H 20/857 |

FOREIGN PATENT DOCUMENTS

| | | | |
|---|---|---|---|
| CN | 206968129 | U | 2/2018 |
| CN | 108461595 | A | 8/2018 |
| CN | 108717832 | A | 10/2018 |
| CN | 110211973 | A | 9/2019 |
| CN | 110265348 | A | 9/2019 |
| CN | 110444684 | A | 11/2019 |
| CN | 110883439 | A | 3/2020 |
| CN | 212256800 | U | 12/2020 |
| CN | 112920734 | A | 6/2021 |
| CN | 113054077 | A | 6/2021 |
| WO | 0201284 | A1 | 1/2002 |

* cited by examiner

DD′
20
22
Y
H1
12
13
13a
3
11
1
10
1
2
3
4
111
111
4
21
2

DISPLAY PANEL AND METHOD FOR MANUFACTURING THE SAME, DISPLAY DEVICE, AND TILED DISPLAY DEVICE

CROSS-REFERENCE TO RELATED APPLICATIONS

This application is a national phase entry under 35 USC 371 of International Patent Application No. PCT/CN2022/103713, filed on Jul. 4, 2022, which claims priority to Chinese Patent Application No. 202110865116.1, filed on Jul. 29, 2021, which are incorporated herein by reference in their entirety.

TECHNICAL FIELD

The present disclosure relates to the field of display technologies, and in particular, to a display panel and a method for manufacturing the same, a display device and a tiled display device.

BACKGROUND

As a new generation of display technology, tiny light-emitting diode (LED) chips include a micro LED chip and a mini LED chip, and are mostly used in display devices for achieving seamless tiling. Mini/Micro LED display devices have the characteristics such as high contrast, long life, and low power consumption.

SUMMARY

In an aspect, a display panel is provided. The display panel includes a circuit backplane and a reflective layer. The circuit backplane includes a first main surface, a second main surface and a plurality of side surfaces. The second main surface is disposed opposite to the first main surface. The plurality of side surfaces each connect the first main surface and the second main surface. At least one side surface in the plurality of side surfaces is a selected side surface. The reflective layer covers the selected side surface, and the reflective layer is configured to be removable under a predetermined process condition.

In some embodiments, a thickness of the reflective layer is H1, and H1 satisfies a relationship: 5 μm≤H1≤20 μm.

In some embodiments, the display panel further includes an adhesion-reducing adhesive layer, and the adhesion-reducing adhesive layer is disposed on a surface of the reflective layer proximate to the selected side surface.

In some embodiments, adhesiveness strength of the adhesion-reducing adhesive layer is S, and S satisfies a relationship: 5 gf/25 mm≤S≤10 gf/25 mm.

In some embodiments, the adhesion-reducing adhesive layer includes thermal adhesion-reducing adhesive or ultraviolet adhesion-reducing adhesive.

In some embodiments, the display panel further includes a plurality of connection leads, and each connection lead in the plurality of connection leads extends from the first main surface to the second main surface through the selected side surface. The reflective layer covers portions of the plurality of connection leads located on the selected side surface.

In some embodiments, the display panel further includes a light blocking layer, and the light blocking layer is disposed on a side of the reflective layer proximate to the selected side surface. The light blocking layer includes a first portion, and the first portion is located on the selected side surface and covers the portions of the plurality of connection leads located on the selected side surface.

In some embodiments, the light blocking layer further includes a second portion, and the second portion covers a portion of the first main surface.

In some embodiments, a direction perpendicular to a boundary line connecting the first main surface to the selected side surface and parallel to the first main surface is a first direction. A length of the second portion in the first direction is a, and a satisfies a relationship: 50 μm≤a≤300 μm.

In some embodiments, the light blocking layer further includes a second portion and a third portion, the second portion covers a portion of the first main surface, the third portion is disposed at an end of the first portion away from the second portion, and the third portion covers at least a portion of the second main surface.

In some embodiments, a direction perpendicular to a boundary line connecting the first main surface to the selected side surface and parallel to the first main surface is a first direction; a dimension of the third portion in the first direction is b, a dimension of the circuit backplane in the first direction is c, and b and c satisfy a relationship: 20 μm≤b≤c.

In some embodiments, an optical density value OD of the light blocking layer satisfies a relationship: OD≥2.

In some embodiments, a material of the light blocking layer includes at least one of thermoplastic polyurethane elastomer rubber and polyimide.

In some embodiments, a thickness of the light blocking layer is H2, and H2 satisfies a relationship: 10 μm≤H2≤100 μm.

In some embodiments, the display panel further includes a plurality of light-emitting devices and a first protective layer. The plurality of light-emitting devices are located on the first main surface. The first protective layer is located on the first main surface. The first protective layer covers the plurality of light-emitting devices and filling gaps between the plurality of light-emitting devices.

In some embodiments, a side surface of the first protective layer proximate to the selected side surface is substantially flush with a side surface of the light blocking layer away from the selected side surface.

In some embodiments, the light blocking layer is provided with a first alignment mark therein, and the circuit backplane is provided with a second alignment mark aligned with the first alignment mark.

In some embodiments, the light blocking layer further includes a second portion and a third portion; the second portion covers a portion of the first main surface, the third portion is disposed at an end of the first portion away from the second portion, and the third portion covers at least a portion of the second main surface. The first alignment mark is located in at least one of the first portion, the second portion and the third portion of the light blocking layer.

In some embodiments, the first alignment mark includes at least two alignment holes, and the alignment holes are each any of a circular hole, a T-shaped hole or a cross hole.

In some embodiments, the display panel further includes a second protective layer, and the second protective layer covers the plurality of connecting leads and fills gaps between the plurality of connecting leads.

In a second aspect, a display device is provided. The display device includes the display panel as described in any of the above embodiments, and a driving circuit board. The driving circuit board is located on a side where the second main surface of the circuit backplane is located. The driving circuit board is coupled to the circuit backplane through a plurality of connection leads.

In a third aspect, a tiled display device is provided. The tiled display device includes a plurality of display devices that are tiled and each as described in the above embodiment.

In a fourth aspect, a method for manufacturing a display panel is provided. The method includes: manufacturing a circuit backplane, the circuit backplane including a first main surface and a second main surface that are oppositely disposed, and a plurality of side surfaces each connecting the first main surface and the second main surface, the first main surface being configured to carry a plurality of light-emitting devices, and at least one side surface in the plurality of side surfaces is a selected side surface; and providing a reflective layer covering the selected side surface, the reflective layer being configured to be removable under a predetermined process condition.

In some embodiments, the method for manufacturing the display panel further includes: providing a light blocking layer covering at least the selected side surface, the light blocking layer including a first portion covering the selected side surface. Providing the reflective layer covering the selected side surface and providing the light blocking layer covering at least the selected side surface, include: attaching the reflective layer to the first portion of the light blocking layer first, and then making a surface of the light blocking layer away from the reflective layer cover at least the selected side surface.

In some embodiments, the light blocking layer further includes a second portion covering a portion of the first main surface, and a third portion covering at least a portion of the second main surface. Making the surface of the light blocking layer away from the reflective layer cover at least the selected side surface, includes one of: that the first portion is attached to the selected side surface first, and then the second portion and the third portion are bent, so that the second portion is attached to the portion of the first main surface, and the third portion is attached to at least the portion of the second main surface; or that the second portion is attached to the portion of the first main surface first, then the first portion is attached to the selected side surface, and finally the third portion is attached to at least the portion of the second main surface; or that the third portion is attached to at least the portion of the second main surface first, then the first portion is attached to the selected side surface, and finally the second portion is attached to the portion of the first main surface.

In some embodiments, before providing the reflective layer covering the selected side surface, the method further includes: forming a plurality of connection leads on the first main surface, the selected side surface and the second main surface, each connection lead in the plurality of connection leads extending from the first main surface to the second main surface through the selected side surface; and forming a second protective layer; the second protective layer covering the plurality of connection leads.

In some embodiments, the method further includes: providing the plurality of light-emitting devices on the first main surface; forming a first protective layer covering the plurality of light-emitting devices and filling gaps between the plurality of light-emitting devices; and removing the reflective layer by the predetermined process condition, the predetermined process condition including at least one of application of external force, heating and light.

In some embodiments, the cutting position is located on aside of the reflective layer away from the selected side surface; in a direction perpendicular to the selected side surface, a distance between the cutting position and the reflective layer is a preset value.

In some embodiments, the preset value is about 0.2 mm.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal to which the embodiments of the present disclosure relate.

DETAILED DESCRIPTION

Figure 1:
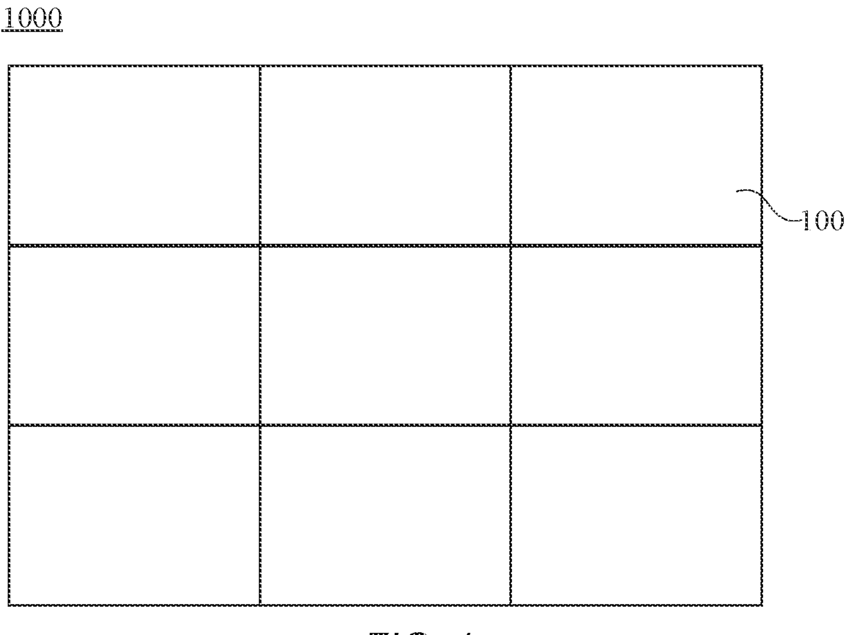
FIG. 1 is a structural diagram of a tiled display device, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, term "a plurality of" or "the plurality of" means two or more unless otherwise specified.

In the description of some embodiments, the expressions "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed here are not necessarily limited to the content herein.

The phrase "at least one of A, B, and C" has the same meaning as the phrase "at least one of A, B, or C", and they both include the following combinations of A, B, and C: only A, only B, only C, a combination of A and B, a combination of A and C, a combination of B and C, and a combination of A, B and C.

The phrase "applicable to" or "configured to" as used herein indicates an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term such as "about", "substantially", or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of a measurement system).

As used herein, the term such as "parallel", "perpendicular" or "equal" include a stated condition and a condition similar to the stated condition. A range of the similar condition is within an acceptable range of deviation. The acceptable range of deviation is determined by a person of ordinary skill in the art in view of measurement in question and errors associated with the measurement of a particular quantity (i.e., limitations of the measurement system). For example, the term "parallel" includes absolute parallelism and approximate parallelism, and an acceptable range of deviation of the approximate parallelism may be a deviation within 5°; the term "perpendicular" includes absolute perpendicularity and approximate perpendicularity, and an acceptable range of deviation of the approximate perpendicularity may also be a deviation within 5°; and the term "equal" includes absolute equality and approximate equality, and an acceptable range of deviation of the approximate equality may be a difference between two equals being less than or equal to 5% of either of the two equals.

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

At present, the strong commercial demand for a high-end large screen can be achieved through image display of a super-large mini/micro light-emitting diode (LED) display device, which is realized by tiling a certain number of small-sized mini/micro LED display devices.

Figure 23:
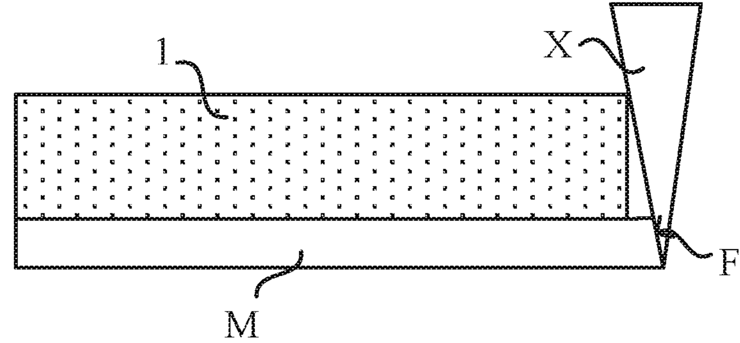
FIG. 23 is a structural diagram of a display panel cut by laser in the related art.

Dimensions of tiled seams of a tiled display device are an important factor affecting a display effect of the tiled display. With reference to FIG. 23, a display panel includes a front encapsulating film M provided on a light-exiting side of a circuit backplane 1. The front encapsulating film M can function as protecting the circuit structure and light-emitting elements. Further, the color of the front encapsulating film M may be a dark color, such as black, dark gray or dark green, which may improve the contrast of the displayed image. In order to obtain the front encapsulating film M matching the size of the display panel, the front encapsulating film M needs to be cut by laser during manufacturing.

Figure 24:
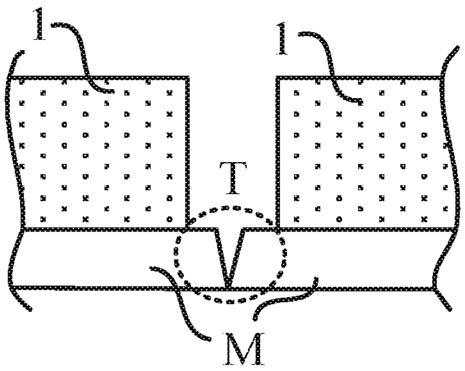
FIG. 24 is a structural diagram of tiling display panels in the related art.

With continued reference to FIG. 23, when the front encapsulating film M is cut by laser, since the laser beam X is tapered, a large taper will exist on a side surface F of the front encapsulating film M. In addition, in order to prevent laser from damaging to wiring on the side surface and even a display area, it is necessary to increase a width of the tiled seam. Thus, in a case where two panels are tiled together, the tiled seam is relatively large and cannot be completely aligned, and it is prone to encounter the problem of contact at a lower end of the tiled position and a large tiled seam at an upper end. With reference to FIG. 24, a tiled seam having an inverted triangular shape T appears at the tiled position, which makes the tiled seam obvious. The obvious tiled seam will cause light leakage at the tiled seam, thereby affecting the display effect.

In light of this, some embodiments of the present disclosure provide a tiled display device 1000, with reference to FIG. 1, the tiled display device 1000 is formed by tiling a plurality of display devices 100. Each display device 100 used for tiling has a small frame size, for example, no more than half of a pitch between two adjacent pixels in each display device 100. Therefore, the tiled seam between two adjacent display devices 100 is less visible to eyes within a viewing range when the tiled display device 1000 is actually viewed. As a result, a good display effect may be presented.

The display device 100 includes a display pane and a driving circuit board. The driving circuit board is used for providing display control signals for the display panel, so as to drive the display panel to realize image display.

Figure 2:
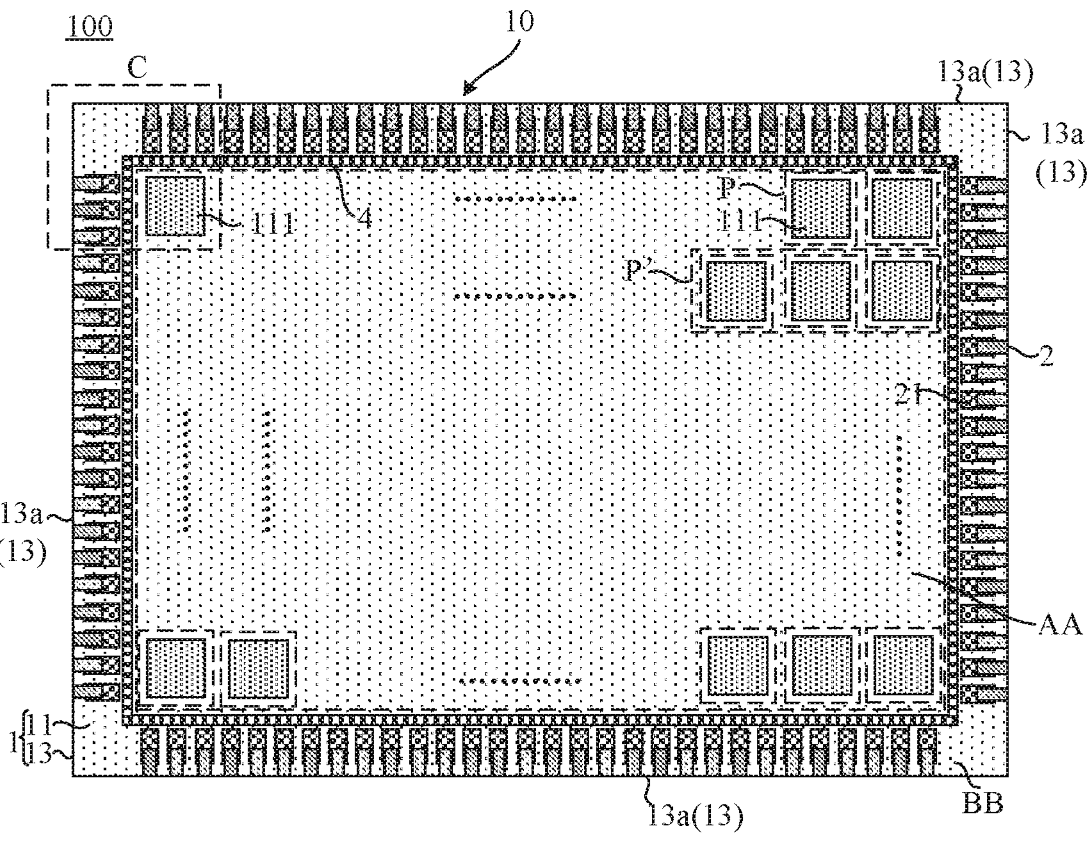
FIG. 2 is a structural diagram of a display device, in accordance with some embodiments of the present disclosure.
Figures 3, 4:
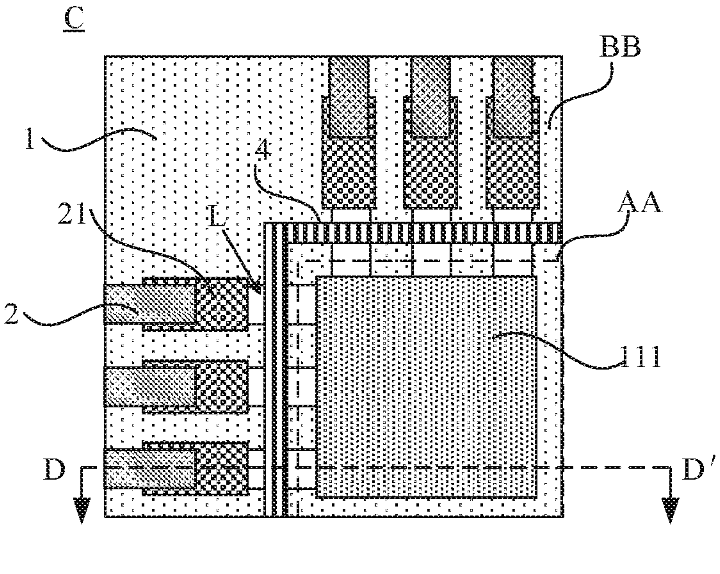
FIG. 3 is a partial structural diagram of a region C of the display device in FIG. 2.
FIG. 4 is a sectional view of a structure of the display device obtained along a direction DD' in the partial structural diagram of the display device in FIG. 3.

Referring to FIGS. 2 to 4, some embodiments of the present disclosure provide a display panel 10, which may be applied to the above display device 100. In some embodiments, the display panel 10 includes a display area (also referred to as an active area, or an active display area) AA and a peripheral area BB located on at least one side of the display area AA.

In the above display panel 10, the display area AA is provided with a plurality of pixels P and a plurality of signal lines L therein, and the plurality of signal lines L are electrically connected to the plurality of pixels P. For example, each pixel P includes sub-pixels P of at least three colors, the sub-pixels P of the plurality of colors include at least a sub-pixel of a first color, a sub-pixel of a second color and a sub-pixel of a third color, and the first color, the second color and the third color are three primary colors (e.g., red, green and blue).

In some embodiments, with reference to FIGS. 4, 5, and 7 to 10, the display panel 10 includes a circuit backplane 1. The circuit backplane 1 includes a first main surface 11, a second main surface 12, and a plurality of side surfaces 13 each connecting the first main surface 11 and the second main surface 12, and at least one side surface in the plurality of side surfaces 13 is a selected side surface **13*a***.

In some examples, multiple side surfaces 13 may be as selected side surfaces **13*a*. For example, with reference to FIG. 2, the first main surface 11 and the second main surface 12 both have rectangular cross sections, and the first main surface 11 and the second main surface 12 are connected by four side surfaces 13. Among the four side surfaces 13, two side surfaces 13 opposite to each other both serve as selected side surfaces 13*a***.

With continued reference to FIGS. 4, 5, and 7 to 10, the first main surface 11 is configured to carry a plurality of light-emitting devices 111. The driving circuit board 20 is located on a side where the second main surface 12 of the circuit backplane 1 is located. The driving circuit board 20 is coupled to the circuit backplane 1 through a plurality of connection leads 2.

Referring to FIGS. 4, 5, and 7 to 10, the display panel 10 further includes a reflective layer 3 covering a selected side surface **13*a*. The reflective layer 3** is configured to be removable under a predetermined process condition.

By providing the above reflective layer 3, when the front encapsulating film is cut by the laser beam directed from the second main surface 12 to the first main surface 11, the taper of the laser beam may be reduced due to reflection of the laser by the reflective layer 3, thereby reducing the expansion size when cutting the front encapsulating film, and reducing the taper of the side surface of the front encapsulating film. Therefore, the width of the tiled seam between the two display panels 10 after being tiled may be reduced. In addition, since the reflective layer 3 is provided on a side where the tiled seam is located, the reflective layer 3 may cause the tiled seam increase. Thus, the reflective layer 3 will be removed under the predetermined process condition after cutting, thereby further reduce the width of the tiled seam. Reducing the width of the tiled seam may improve light leakage at the tiled seam, thereby improving the display effect.

In some examples, the circuit backplane 1 includes a substrate and a driving circuit layer disposed on a side of the substrate. The material of the substrate may be selected from rigid materials such as glass, quartz, and plastic. The driving circuit layer includes, for example, thin film transistors (TFTs) or micro driving chips, and the above plurality of signal lines L and other structures. The driving circuit layer is coupled to the plurality of light-emitting devices and is configured to drive the plurality of light-emitting devices to emit light.

In some embodiments, a thickness of the reflective layer 3 is H1, and H1 is greater than or equal to 5 μm and less than or equal to 20 μm (i.e., 5 μm≤H1≤20 μm). For example, the thickness H1 of the reflective layer 3 is 5 μm, 15 μm or 20 μm.

In a case where the thickness of the reflective layer 3 is in the range of 5 μm to 20 μm, it may not only make the reflective layer 3 play a good role of reflecting light, but also prevent an excessive large distance between the circuit backplanes 1 in the adjacent display panel 10 from affecting the display effect. For example, in a case where the thickness of the reflective layer 3 is equal to or close to 5 μm, a distance between the laser beam and the selected side surface **13*a* may be relatively small, and after the reflective layer 3 is removed, a side surface obtained after laser cutting is close to the selected side surface 13*a*, which is beneficial to reduce the distance between adjacent selected side surfaces 13*a* of two display panels 10 during tiling. As a result, a good display effect may be presented. For another example, in a case where the thickness H1 of the reflective layer 3 is equal to or close to 20 μm, the reflective layer 3 may have a sufficient thickness, so that the reflective layer 3** may reflect light well.

In addition, it will be noted that due to certain uncontrollable errors (e.g., manufacturing process errors, equipment accuracy, measurement errors), in a case where the thickness H1 of the reflective layer 3 is 4.9 μm, 4.96 μm or any other value (e.g., a floating range does not exceed 0.5 μm), it may be considered that the thickness H1 of the reflective layer 3 satisfies the limiting condition of being equal to 5 μm; and in a case where the thickness H1 of the reflective layer 3 is 20.1 μm, 20.35 μm or any other value (e.g., the floating range does not exceed 0.5 μm), it may also be considered that the thickness H1 of the reflective layer 3 satisfies the limiting condition of being equal to 20 μm.

In some embodiments, the predetermined process condition includes applying at least one of external force, heating and light.

The reflective layer 3 may be removed by one or a combination of a plurality of the above manners. It can be understood that the reflective layer 3 may be removed by applying external force or light or heating, the operation is simple and the practicality is strong.

Figure 5:
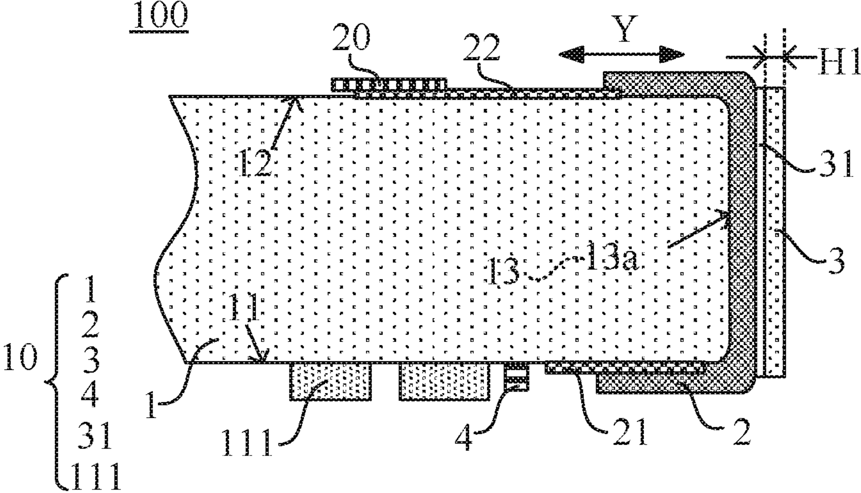
FIG. 5 is a sectional view of a structure of a display device, in accordance with some embodiments of the present disclosure.

In some embodiments, referring to FIG. 5, a surface of the reflective layer 3 proximate to the selected side surface 13*a* is provided with an adhesion-reducing adhesive layer 31.

The adhesiveness of the adhesion-reducing adhesive layer 31 may decrease under certain conditions. In a case where the reflective layer 3 is bonded by the adhesion-reducing adhesive layer 31, the adhesiveness of the adhesion-reducing adhesive layer 31 may be reduced under certain conditions, so that the reflective layer 3 and the adhesion-reducing adhesive layer 31 may be removed together. If other curing adhesive is used, when the reflective layer 3 is directly torn off by applying an external force, it is prone to cause damage to the pasting surface or other nearby structures. Therefore, by providing the adhesion-reducing adhesive layer 31 to bond the reflective layer 3, the reflective layer 3 is easy to be removed, and the removal will not cause damage to the pasting surface and the nearby structures. Moreover, the adhesion-reducing adhesive layer 31 is easy to be removed and is not easy to be residual, and thus it will not affect other performances of the display panel 10.

In some embodiments, adhesiveness strength of the adhesion-reducing adhesive layer 31 is S, and S is greater than or equal to 5 gf/25 mm and less than or equal to 10 gf/25 mm (i.e., 5 gf/25 mm≤S≤10 gf/25 mm). For example, the adhesiveness strength S of the adhesion-reducing adhesive layer 31 is 5 gf/25 mm or 10 gf/25 mm.

The expression of "gf/25 mm" represents the number of grams (g) of force borne per 25 millimeters of length, that is, the tensile force borne per 25 square millimeters of area. In a case where the adhesiveness strength S of the adhesion-reducing adhesive layer 31 is in the range of 5 gf/25 mm to 10 gf/25 mm, it means that the tensile force that the adhesion-reducing adhesive layer 31 per 25 square millimeters can bear is in a range of 5 g to 10 g. The adhesiveness strength of the adhesion-reducing adhesive layer 31 being within the above range may ensure that the adhesion-reducing adhesive layer 31 has a relatively high bonding strength, thereby ensuring the firm fixation of the reflective layer 3. In addition, the adhesiveness of the adhesion-reducing adhesive layer 31 is not excessively high, which is convenient for removal after laser cutting.

In some embodiments, the adhesion-reducing adhesive layer 31 includes thermal adhesion-reducing adhesive or ultraviolet (UV) adhesion-reducing adhesive.

The thermal adhesion-reducing adhesive or the UV adhesion-reducing adhesive has the advantage of easy removal. In some examples, the adhesive strength may be reduced by heating the thermal adhesion-reducing adhesive, so as to remove the adhesion-reducing adhesive layer 31. In some other examples, the adhesive force of the UV adhesion-reducing adhesive may be sharply reduced by irradiating ultraviolet rays on the UV adhesion-reducing adhesive, so as to remove the adhesion-reducing adhesive layer 31.

In some examples, with reference to FIGS. 2 to 10, the display panel 10 further includes a plurality of connecting leads 2, and each connecting lead 2 in the plurality of connecting leads 2 extends from the first main surface 11 to the second main surface 12 through the selected side surface 13*a*. The reflective layer 3 covers portions of the plurality of connection leads 2 located on the selected side surface 13*a*.

It can be understood that the connection leads 2 extend from the first main surface 11 to the second main surface 12 through the selected side surface 13*a*, that is to say, the display panel 10 adopts a side wiring manner, and the side wiring manner causes conductive patterns on two opposite surfaces of the display panel 10 to be coupled. For example, the plurality of light-emitting devices 111 located on the first main surface 11 are coupled to the driving circuit board 20 located on the second main surface 12 by the plurality of connection leads 2, so that the driving circuit board 20 may provide electrical signals to control the plurality of light-emitting devices to emit light. The side wiring may narrow the frame of the display device, and the connecting leads 2 in the side wiring are mutually independent electrical paths. The reflective layer 3 covers the portions of the connection leads 2 located on the selected side surface 13*a*, so as to protect the connection leads 2 located on the selected side surface 13*a* and prevent the connection leads 2 from being damaged by the laser beam for cutting.

Figure 6:
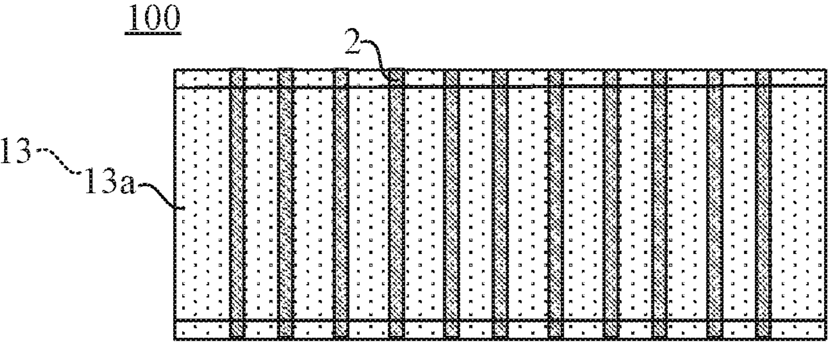
FIG. 6 is a structural diagram of a plurality of connecting leads on a selected side surface in a display device, in accordance with some embodiments of the present disclosure.
Figure 7:
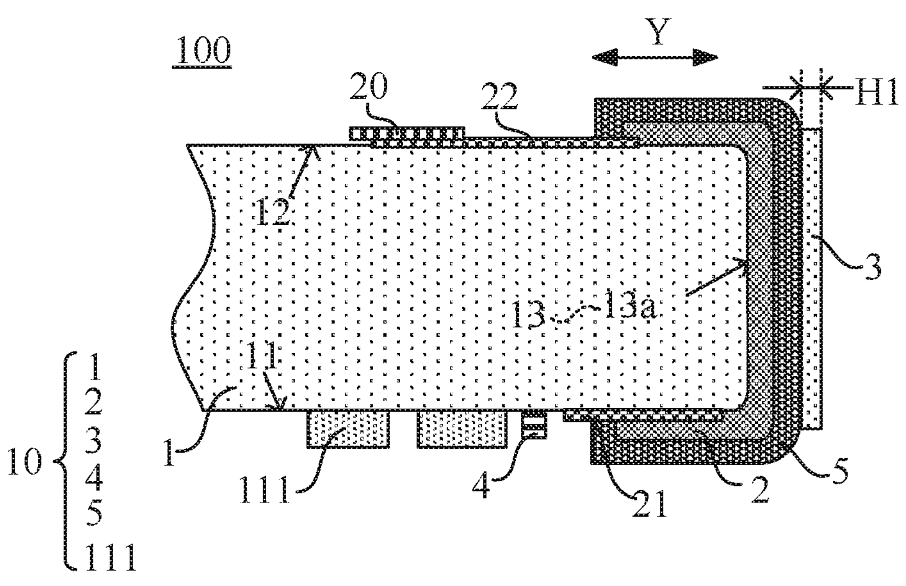
FIG. 7 is a sectional view of a structure of another display device, in accordance with some embodiments of the present disclosure.

In some examples, with reference to FIGS. 2, 3 and 6, the plurality of connection leads 2 are arranged parallel to each other and at intervals. The width of each connecting lead 2 is not limited and is related to the size of the structure coupled thereto, and may be set according to actual needs.

In some embodiments, as shown in FIGS. 2 to 10, the display panel 10 further includes a plurality of first electrodes 21 and a plurality of second electrodes 22.

The plurality of first electrodes 21 are disposed on the first main surface 11, and each first electrode 21 is coupled to a portion of a connecting lead 2 located on the first main surface 11. Each first electrode 21 is coupled to a light-emitting device 111, and outputs a signal transmitted by the connection lead 2 to the corresponding light-emitting device 111 to realize image display.

The plurality of second electrodes 22 are disposed on the second main surface 12, and each second electrode 22 is coupled to a portion of the connection lead 2 located on the second main surface 12. Each second electrode 22 is coupled to the driving circuit board 20, and the driving circuit board 20 controls the signal transmission of the corresponding connection lead 2.

In some embodiments, referring to FIGS. 2 to 5 and 7 to 10, the display pane 10 further includes a barrier wall 4. The barrier wall 4 is disposed on the peripheral area BB of the display panel, and is disposed in a gap area between the plurality of light-emitting devices 111 and the plurality of first electrodes 21. For example, with reference to FIG. 2, the barrier wall 4 may be provided on a periphery of the display area AA, such as around the display area AA. Alternatively, the barrier wall 4 may be provided only on a side of the peripheral area BB proximate to the selected side surface 13*a*.

The barrier wall 4 is formed before the plurality of connection leads 2 are formed, so that in a process of forming the plurality of connection leads 2, for example, during forming the plurality of connection leads 2 using a sputtering process, the barrier wall 4 can prevent the material of the plurality of connection leads 2 from being sputtered to the display area AA of the display panel 10, which may affect the manufacturing accuracy of each component in the display area AA.

In some examples, a thickness of the barrier wall 4 is greater than a thickness of the portion of the connecting lead 2 located on the first main surface 11, and smaller than a total thickness of both the portion of the connecting lead 2 located on the first main surface 11 and all film layers laminated on a surface of the connecting lead 2.

In some examples, the material of the barrier wall 4 is not limited, as long as it can prevent the material of the plurality of connection leads 2 from being sputtered to the display area AA. For example, the barrier wall 4 is made of an elastic material, and the elastic material may be a resin material, or a stack of the resin material and a film material of a metal film layer.

In some embodiments, with reference to FIGS. 7 to 10, the display panel 10 further includes a second protective layer 5. The second protective layer 5 covers the plurality of connection leads 2 and fills gaps between the plurality of connection leads 2.

The second protective layer 5 is an anti-corrosion layer, which may protect the connecting leads 2 and prevent increase in resistance or even fracture of connection leads 2 caused by the connecting leads 2 being corroded due to prolonged contact with moisture and oxygen.

In some examples, the material of the second protective layer 5 is a material with high oxidation resistance, which may block external moisture and oxygen, and prevent the connecting leads 2 from being corroded. For example, the material of the second protective layer 5 includes an over coating (OC) adhesive or a dark ink material. The OC adhesive includes a black adhesive or a white adhesive. For example, the second protective layer 5 is a black adhesive layer. The dark ink material has properties of high hardness and good corrosion resistance, and may cover the plurality of connecting leads 2, thereby protecting the connecting leads well.

Figure 8:
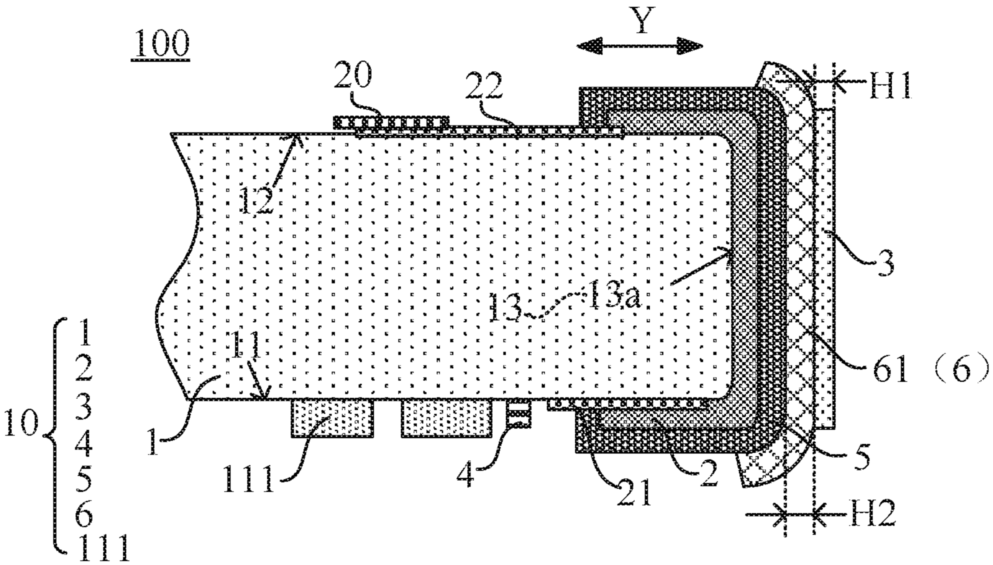
FIG. 8 is a sectional view of a structure of yet another display device, in accordance with some embodiments of the present disclosure.
Figure 9:
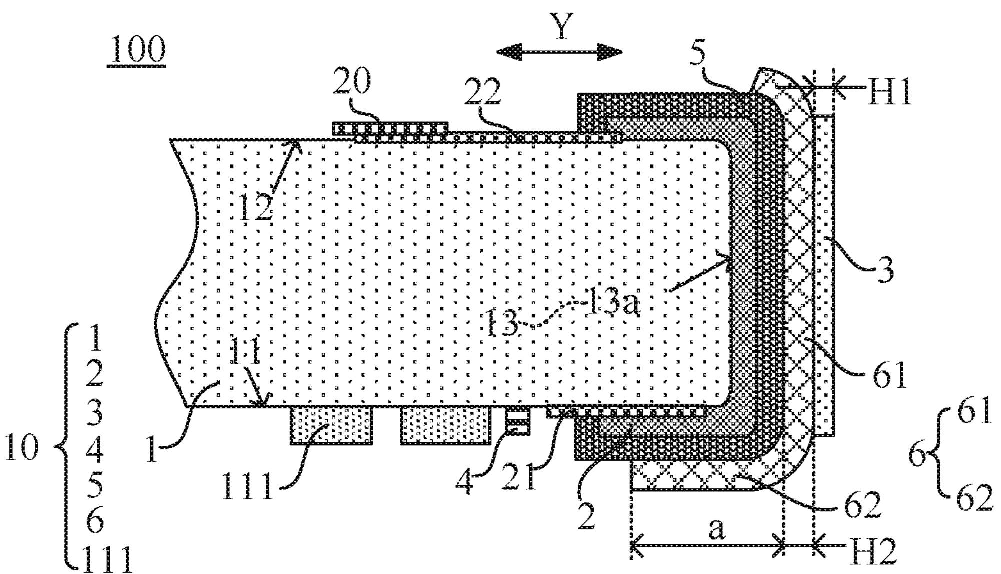
FIG. 9 is a sectional view of a structure of yet another display device, in accordance with some embodiments of the present disclosure.
Figure 10:
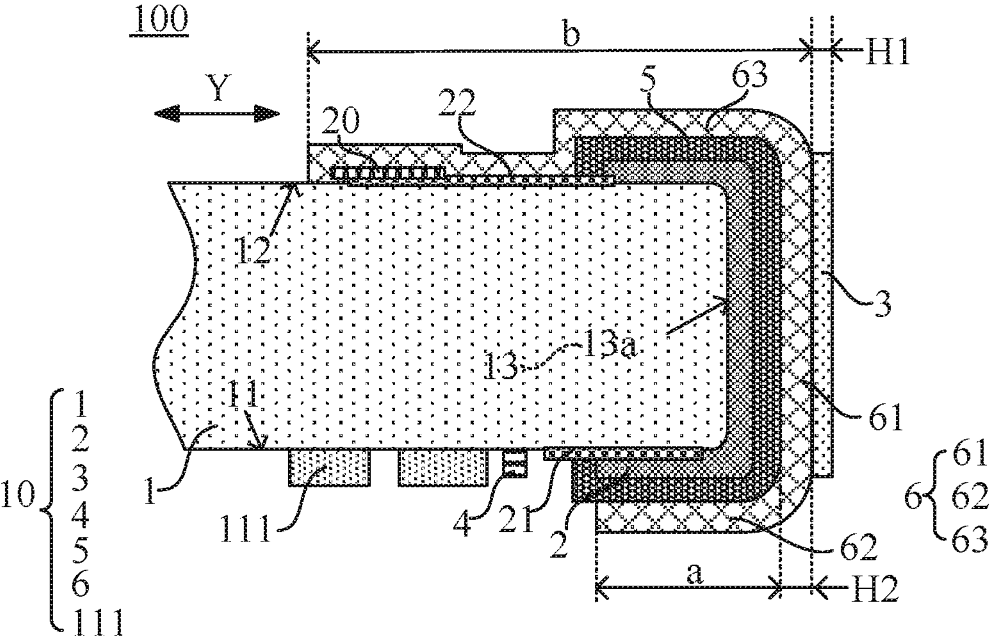
FIG. 10 is a sectional view of a structure of yet another display device, in accordance with some embodiments of the present disclosure.

In some embodiments, with reference to FIGS. 8 to 10, the display panel 10 further includes a light blocking layer 6, and the light blocking layer 6 is disposed on a side of the reflective layer 3 proximate to the selected side surface 13*a*. The light blocking layer 6 includes a first portion 61, and the first portion 61 is located on the selected side surface 13*a* and covers the portion of the plurality of connection leads 2 located on the selected side surface 13*a*.

Such a design may solve light leakage from the side surface of the display panel 10. In addition, the light blocking layer 6 may also function to protect the plurality of connection leads 2 on the selected side surface 13*a*.

In some examples, the reflective layer 3 is disposed on a side of the light blocking layer 6 away from the selected side surface 13*a*. The reflective layer 3 may protect the light blocking layer 6 and prevent the light blocking layer 6 from being damaged during laser cutting.

In some embodiments, referring to FIGS. 9 and 10, the light blocking layer 6 further includes a second portion 62, and the second portion 62 covers a portion of the first main surface 11.

The second portion 62 is located in the peripheral area BB of the first main surface 11, and the second portion 62 may play a role of overlapping, so as to strengthen the fixing effect of the light blocking layer 6 and prevent the light blocking layer 6 from falling off.

In some embodiments, with reference to FIGS. 9 and 10, a direction perpendicular to a boundary line connecting the selected side surface 13*a* to the first main surface 11 and parallel to the first main surface 11 is a first direction Y. A length of the second portion 62 in the first direction Y is a, and a is greater than or equal to 50 μm and less than or equal to 300 μm (i.e., 50 μm≤a≤300 μm). For example, the length a is 50 μm, 100 μm or 300 μm.

It will be noted that, during the manufacture of the display panel, a die-bonding operation is required. Die-bonding refers to a process of bonding a chip to a designated area of the display panel through colloid (generally conductive adhesive or insulating adhesive for LEDs) to form a thermal or electrical path, and providing conditions for subsequent wiring connections. Due to the requirements of the die-bonding operation of the die-bonding apparatus, there need to be an appropriate distance between the light-emitting device 111 and other devices. In a case where the length a is equal to or close to 50 μm, the operation requirements of the ide-bonding equipment may be satisfied. In addition, the seamless tiling structure has certain requirements for the distance between the light-emitting device 111 and an outerframe, that is, the distance between the light-emitting device 111 and the outer frame cannot be too long, otherwise the distance between the light-emitting devices 111 of adjacent panels is too large, which will affect the display effect at the tiled position. Therefore, in a case where the length a is equal to or close to 300 μm, the requirements of the seamless tiled product for the distance of the light-emitting device 111 may be satisfied, thereby ensuring a good tiling display effect.

In addition, it will be noted that due to certain uncontrollable errors (e.g., manufacturing process errors, equipment accuracy, measurement errors), in a case where the length a is 49.8 μm, 49.98 μm or any other value (e.g., a floating range does not exceed 0.5 μm), it may be considered that the length a satisfies the limiting condition of being equal to 50 μm; and in a case where the length a is 300.1 μm, 300.35 μm or any other value (e.g., the floating range does not exceed 0.5 μm), it may also be considered that the length a satisfies the limiting condition of being equal to 300 μm.

In some embodiments, with reference to FIG. 10, the light blocking layer 6 further includes a third portion 63. The third portion 63 is disposed at an end of the first portion 61 away from the second portion 62, and the third portion 63 covers at least a portion of the second main surface 12.

It will be noted that the second main surface 12 is a surface opposite to the first main surface 11 (i.e., a light-exiting surface of the display panel 10), that is, the second main surface 12 is a back surface of the display panel 10. Light emitted by the light-emitting devices 111 needs to exit from the front surface (i.e., the first main surface 11) to display the images, and the light leakage from the back surface will affect the display effect. Therefore, the light blocking layer 6 includes the third portion 63 disposed on the second main surface 12, which may effectively improve light leakage from the back surface of the display panel 10.

The above "covering at least a portion of the second main surface" means that a whole or a part of the second main surface 12 is covered by the light blocking layer 6, and the specific coverage range may be selected according to the required display effect, the size of the display panel, and other conditions.

Figure 11:
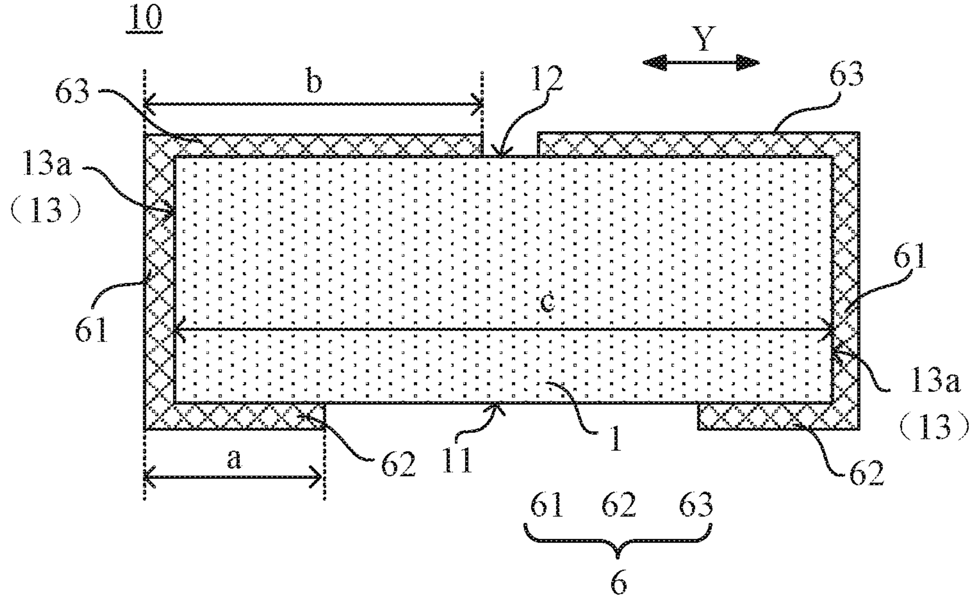
FIG. 11 is a front view of a structure of a light blocking layer in a display panel, in accordance with some embodiments of the present disclosure.
Figure 12:
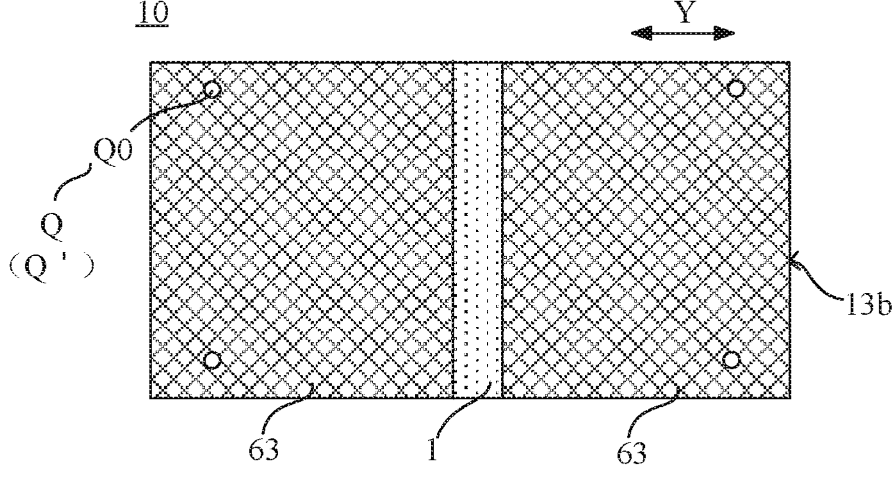
FIG. 12 is a top view of a structure of a light blocking layer in a display panel, in accordance with some embodiments of the present disclosure.

In some examples, referring to FIGS. 11 and 12, the two opposite side surfaces 13 of the display panel 10 are selected side surfaces 13*a*. The two selected side surfaces 13*a* are respectively provided with light blocking layers 6, and the two light blocking layers each includes a first portion 61, a second portion 62 and a third portion 63. The third portions 63 on both sides cover the second main surface 12 together, and in the first direction Y, the third portions 63 partially cover the second main surface 12.

In some embodiments, referring to FIG. 11, a direction perpendicular to a boundary line connecting the selected side surface 13*a* to the first main surface 11 and parallel to the first main surface 11 is a first direction Y. A dimension of the third portion 63 in the first direction is b, a dimension of the circuit backplane 1 in the first direction is c, and b and c satisfy the following relationship: 20 μm≤b≤c.

In a case where the length b of the third portion 63 in the first direction Y is in the range of 20 μm to c, it may not only ensure a good light-blocking effect of the third portion 63 on the second main surface 12, but also ensure reliable fixation of the light blocking layer 6, thereby prevents the light blocking layer 6 from slipping off when attaching. In a case where the length b is equal to or close to 20 μm, it may ensure that the third portion 63 can be stably fixed on the second main surface 12, thereby ensuring reliable fixation of the entire light blocking layer 6 and preventing the light blocking layer 6 from falling off from the third portion 63. In a case where the length b is equal to or close to c, it may ensure that the back surface of the display panel 10 (i.e., a side where the second main surface 12 is located) has a good anti-light leakage effect.

In addition, it will be noted that due to certain uncontrollable errors (e.g., manufacturing process errors, equipment accuracy, measurement errors), in a case where the length b is 20.4 μm, 20.38 μm or any other value (e.g., a floating range does not exceed 0.5 μm), it may be considered that the length b satisfies the limiting condition of being equal to 20 μm.

In some embodiments, the optical density value OD of the light blocking layer is greater than or equal to 2 (i.e., OD Z 2). For example, the optical density value OD of the light blocking layer is 2, 3, 4 or 5.

The optical density is also referred to as absorbance. The optical density value OD refers to a common logarithm of a ratio of the intensity of incident light to the intensity of the transmitted light. The calculation formula is that (OD=Ig (incident light/transmitted light)) or that (OD=Ig (1/light transmittance)). It can be seen from the formula that in a case where the OD takes a value greater than or equal to 2, the value of the light transmittance of the light blocking layer 6 is less than or equal to 1%, that is, only less than 1% of the light incident on the light blocking layer 6 may pass through the light blocking layer. Such a design may ensure a good light-blocking effect of the light blocking layer 6.

The material of the light blocking layer 6 includes at least one of thermoplastic polyurethane elastomer rubber and polyimide.

Since thermoplastic polyurethane elastomer rubber has good toughness, the light blocking layer 6 made of this material may satisfy the bending requirement of the light blocking layer 6. Polyimide has good toughness and strength, which may satisfy the bending requirements of the light blocking layer 6, and has sufficient strength. As a result, it is easy to bend and not easily broken, and may play a good role of protection and light-blocking effect.

In some examples, the light blocking layer 6 is made of a dark-colored film material. Compared with light-colored film material, in a case where other parameters are the same, the darker the color, the better the light-blocking effect. For example, the light blocking layer 6 is a black film.

In some embodiments, a thickness of the light block layer 6 is H2, and H2 is greater than or equal to 10 μm and less than or equal to 100 μm (i.e., 10 μm≤H2≤100 μm). For example, the thickness of the light block layer 6 is 10 μm, 50 μm, or 100 μm.

The thickness of the light blocking layer is in the range of 10 μm to 100 μm. In a case where the thickness H2 of the light blocking layer 6 is equal to or close to 10 μm, the light blocking layer 6 may be avoided being too thin, thereby ensuring a good light-blocking effect of the light blocking layer 6. In a case where the thickness H2 of the light blocking layer 6 is equal to or close to 100 μm, the light blocking layer 6 may be avoided being too thick, thereby avoiding the light blocking layer 6 being unable to tightly attached due to rebound when the light blocking layer 6 is bent.

In addition, it will be noted that due to certain uncontrollable errors (e.g., manufacturing process errors, equipment accuracy, measurement errors), in a case where the thickness H2 of the light blocking layer 6 is 9.8 μm, 9.78 μm or any other value (e.g., a floating range does not exceed 0.5 μm), it may be considered that the thickness H2 of the light blocking layer 6 satisfies the limiting condition of being equal to 10 μm; and in a case where the thickness H2 of the light blocking layer 6 is 100.1 μm, 100.35 μm or any other value (e.g., a floating range does not exceed 0.5 μm), it may also be considered that the thickness H2 of the light blocking layer 6 satisfies the limiting condition of being equal to 100 μm.

Figure 13:
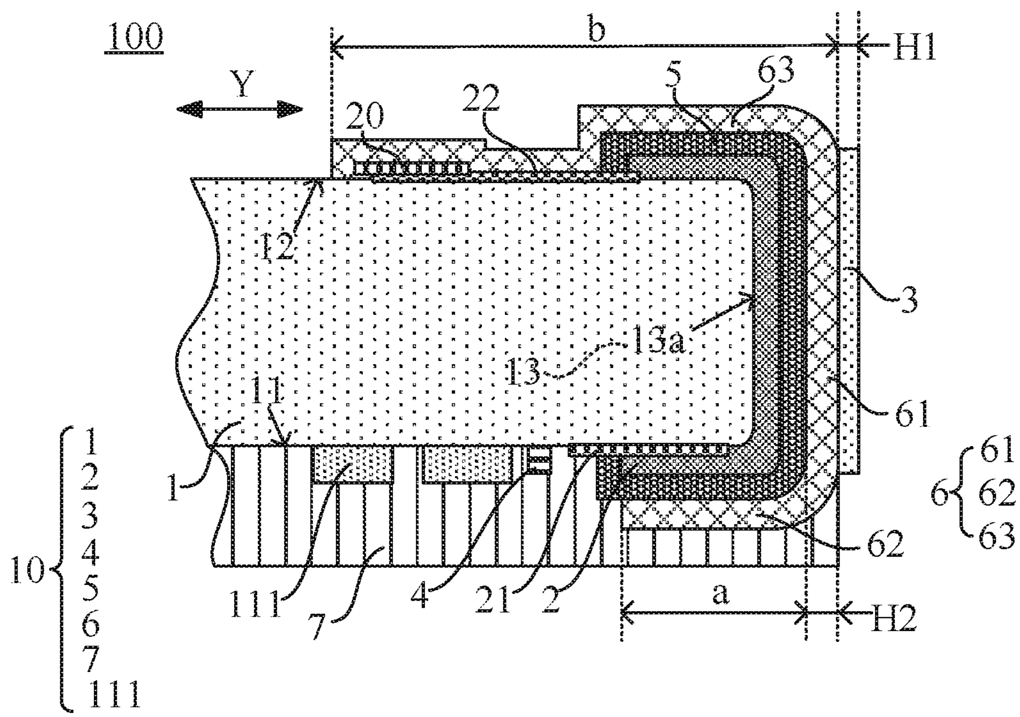
FIG. 13 is a sectional view of a structure of yet another display device, in accordance with some embodiments of the present disclosure.

In some embodiments, with reference to FIG. 13, the display panel 10 further includes the plurality of light-emitting devices 111 and a first protective layer 7 (i.e., the above front encapsulating film). The plurality of light-emitting devices 111 are located on the first main surface 11, and the first protective layer 7 covers the plurality of light-emitting devices 111 located on the first main surface 11 and fills gaps between the plurality of light-emitting devices 111.

In some examples, in a case where the light blocking layer 6 includes the second portion 62 on the first main surface 11, the first protective layer 7 further covers the second portion 62 of the light blocking layer 6. The first protective layer 7 plays a role of further protecting the circuit structure, for example, protecting the plurality of light-emitting devices 111, so as to avoid damage to the light-emitting devices 111 caused by subsequent processes.

In some examples, the material of the first protective layer 7 has high light transmittance and a dark color. For example, the material of the first protective layer 7 may be black silica gel or black resin. Thus, while protecting the plurality of light-emitting devices 111, it may be possible to ensure a light-emitting efficiency of the plurality of light-emitting devices 111, and avoid a reduction of contrast of an image caused by reflection of external ambient light after being incident on, for example, a metal material pattern of the display panel 10, thereby improving the contrast.

In some embodiments, with continued reference to FIG. 13, a side surface of the first protective layer 7 proximate to the selected side surface 13*a* is substantially flush with a side surface of the light blocking layer 6 away from the selected side surface 13*a*.

That is, the side surface of the first protective layer 7 obtained after the first protective layer 7 is cut by laser is substantially flush with the side surface of the light blocking layer 6 away from the selected side surface 13*a*. Therefore, after the reflective layer 3 is removed and when the two display devices is tiled, the adjacent light blocking layers 6 may be aligned, and the adjacent first protective layers 7 may be aligned. In this way, the distance between the adjacent display panels 10 may be reduced while the minimum tiled seam is achieved.

In some embodiments, with reference to FIG. 12, the light blocking layer 6 is provided therein with a first alignment mark Q, and the circuit backplane 1 is provided therein with a second alignment mark Q' aligned with the first alignment mark Q.

Such a design may provide alignment reference for the light blocking layer 6 when the light blocking layer 6 is attached, so as to ensure that the light blocking layer 6 is attached to a predetermined position, thereby ensuring the attaching accuracy.

In some embodiments, the first alignment mark Q is located in at least one of the first portion 61, the second portion 62 and the third portion 63 of the light blocking layer 6.

In a case where the light blocking layer 6 only includes the first portion 61, the first alignment mark Q is located in the first portion 61. In a case where the light blocking layer 6 further includes the second portion 62 and/or the third portion 63, according to the attachment order, the first alignment mark Q is provided at a portion where attachment is performed first. In a case where the first alignment mark Q is provided at the portion where attachment is performed first, it may ensure a high attaching accuracy of the portion where attachment is performed first. Since the remaining portions and the first portion 61 are of an integral structure, the remaining portions are attached sequentially with the portion where attachment is performed first, which may also ensure a high attaching accuracy of the remaining portions.

In some embodiments, referring to FIG. 12, the first alignment mark Q includes at least two alignment holes Q0, and the alignment hole is any of a circular hole, a T-shaped hole, and a cross hole.

The first alignment mark Q is in the form of an alignment hole, which is convenient to manufacture and may realize the positioning mark effect well. Moreover, after the attachment surface is determined, at least two alignment holes are required at the positioning attachment position to completely position the light blocking layer 6.

In some examples, with reference to FIG. 12, the first alignment mark Q adopts two circular holes arranged at intervals, and the two circular holes are arranged at intervals in a length direction of a boundary edge 13*b* of the second main surface 12 and the selected side surface 13*a*. The corresponding second alignment mark Q' also adopts two circular holes.

In some other examples, the first alignment mark Q adopts cross holes, and the second alignment mark Q' adopts circular holes.

Figure 14:
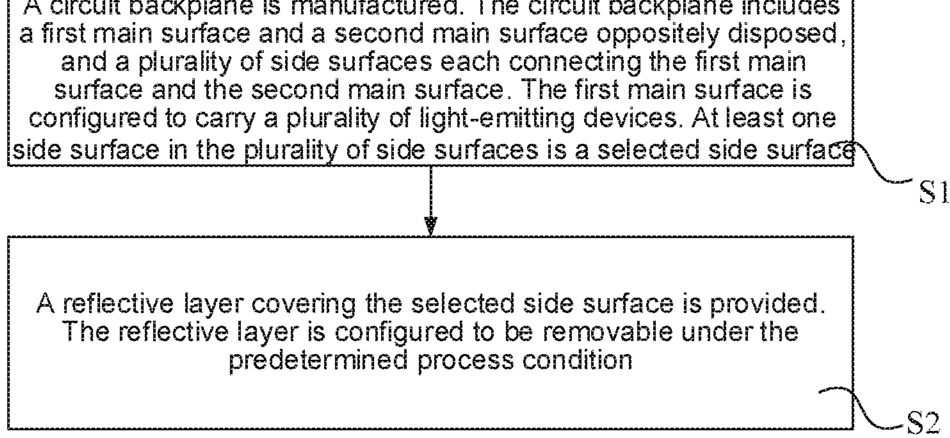
FIG. 14 is a flow diagram of a method for manufacturing a display panel, in accordance with some embodiments of the present disclosure.

Based on the above technical solution of the display panel, some embodiments of the present disclosure provide a method for manufacturing a display panel. Referring to FIGS. 5 and 14, the method includes S1 and S2.

In S1, a circuit backplane 1 is manufactured. The circuit backplane 1 includes a first main surface 11 and a second main surface 12 oppositely disposed, and a plurality of side surfaces 13 each connecting the first main surface 11 and the second main surface 12. The first main surface 11 is configured to carry a plurality of light-emitting devices 111. At least one side surface 13 in the plurality of side surfaces 13 is a selected side surface 13*a*.

In S2, a reflective layer 3 covering the selected side surface 13*a* is provided. The reflective layer 3 is configured to be removable under the predetermined process condition.

The reflective layer 3 is disposed on the selected side surface 13*a* of the circuit backplane 1. When the front encapsulating film is cut by the laser beam directed from the second main surface 12 to the first main surface 11, the taper of the laser beam may be reduced due to reflection of the laser by the reflective layer 3, thereby reducing the expansion size when cutting the front encapsulating film, and reducing the taper of the side surface of the front encapsulating film. Therefore, the width of the tiled seam between the two display panels 10 after being tiled may be reduced. In addition, since the reflective layer 3 is provided on a side where the tiled seam is located, the reflective layer 3 may cause the tiled seam increase. Thus, the reflective layer 3 will be removed under the predetermined process condition after cutting, thereby further reduce the width of the tiled seam. Reducing the width of the tiled seam may improve light leakage at the tiled seam, thereby improving the display effect.

Figure 15:
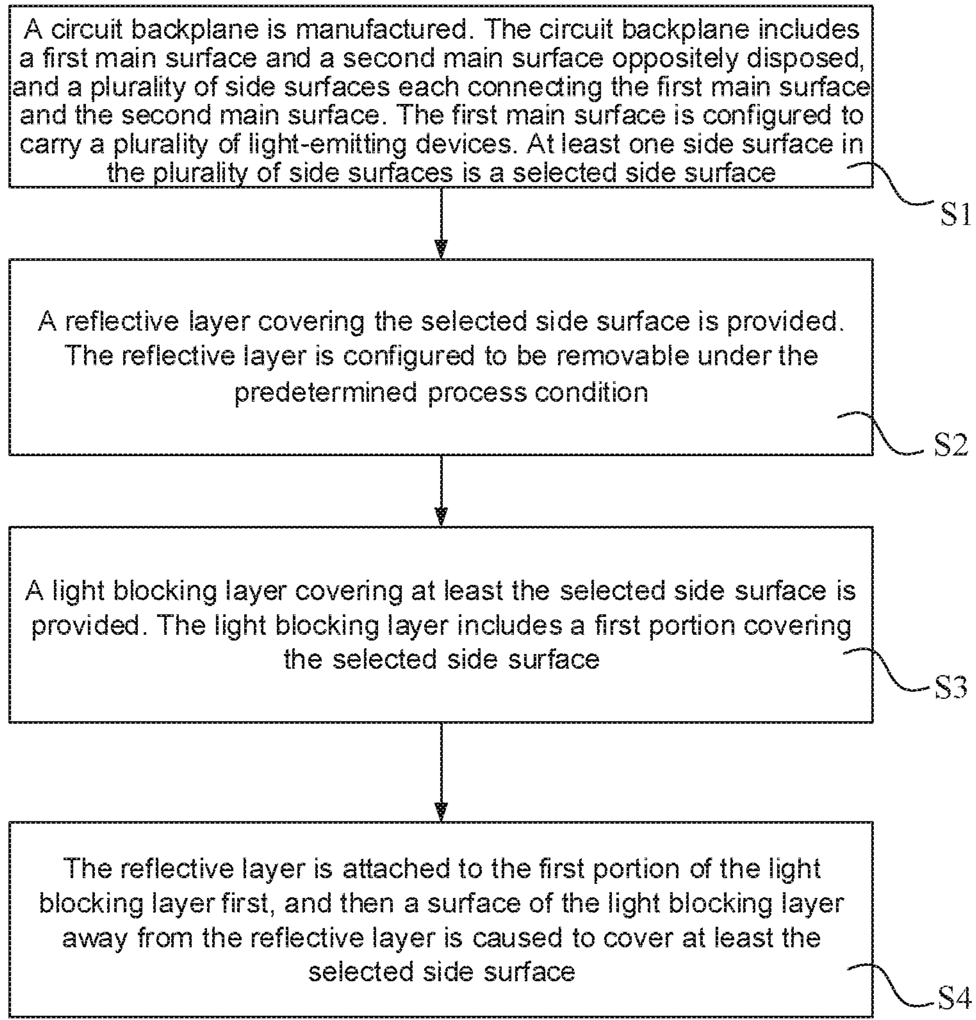
FIG. 15 is a flow diagram of another method for manufacturing a display panel, in accordance with some embodiments of the present disclosure.
Figure 16:
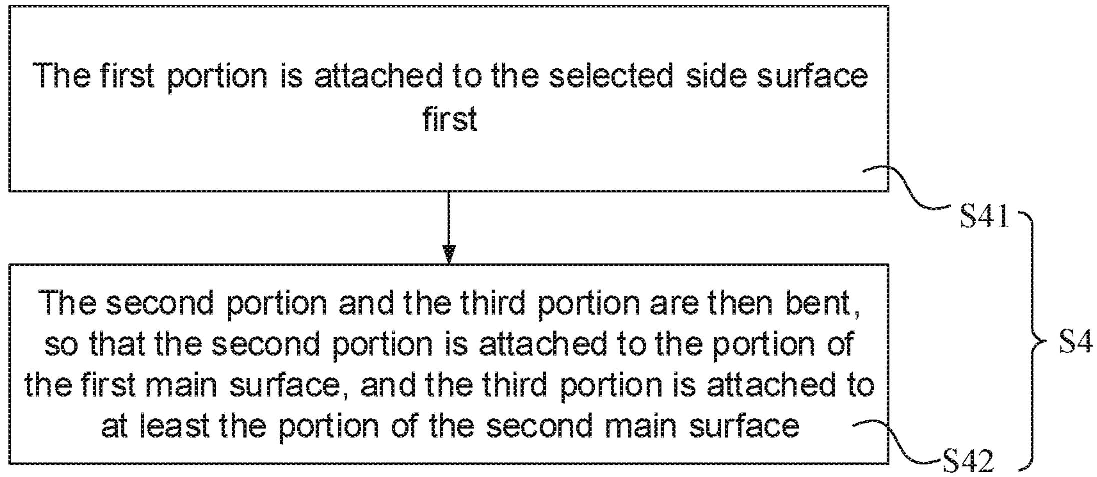
FIG. 16 is a flow diagram of yet another method for manufacturing a display panel, in accordance with some embodiments of the present disclosure.
Figure 17:
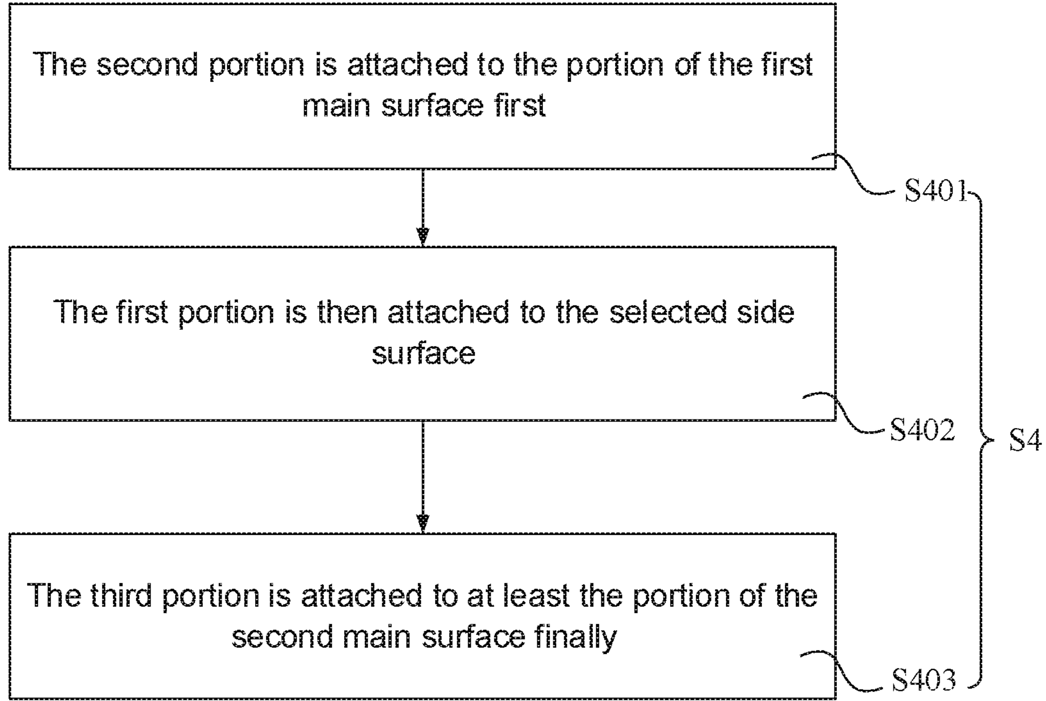
FIG. 17 is a flow diagram of yet another method for manufacturing a display panel, in accordance with some embodiments of the present disclosure.
Figure 18:
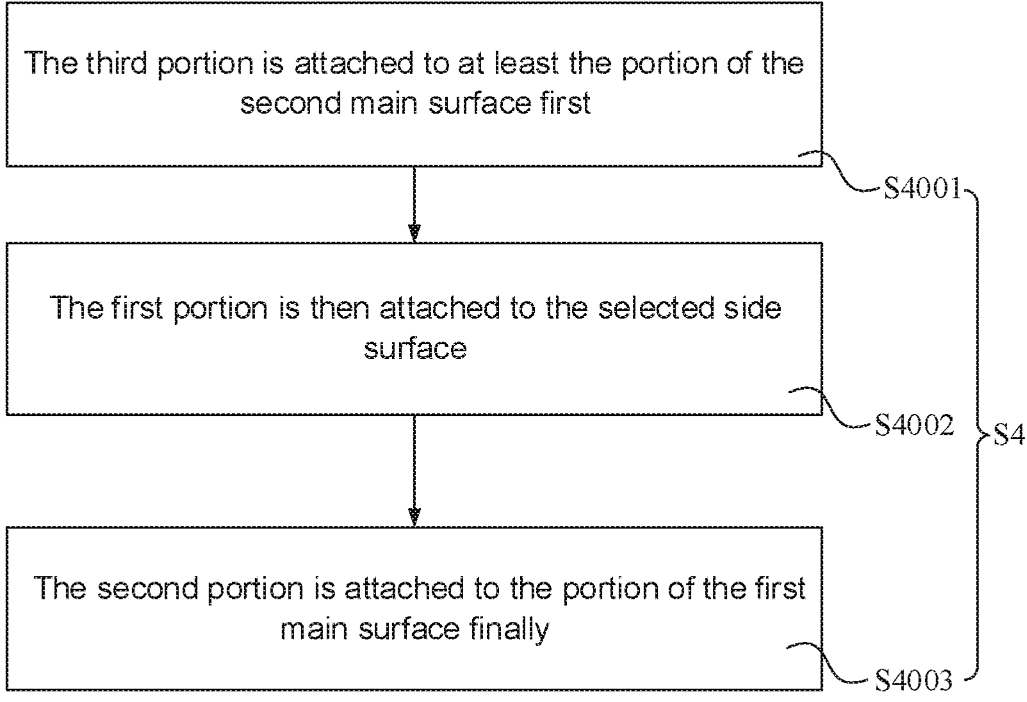
FIG. 18 is a flow diagram of yet another method for manufacturing a display panel, in accordance with some embodiments of the present disclosure.

In some embodiments, referring to FIGS. 8 and 15, the method for manufacturing the display panel further includes S3.

In S3, a light blocking layer 6 covering at least the selected side surface 13*a* is provided. The light blocking layer 6 includes a first portion 61 covering the selected side surface 13*a*.

The steps of providing the reflective layer 3 covering the selected side surface 13*a* and providing the light blocking layer 6 covering at least the selected side surface 13*a* include S4.

In S4, the reflective layer 3 is attached to the first portion 61 of the light blocking layer 6 first, and then a surface of the light blocking layer 6 away from the reflective layer 3 is caused to cover at least the selected side surface 13*a*.

Such a design may improve the attaching accuracy and simplify the process flow, and only needs to perform sequential attaching operations on the circuit backplane 1.

In some embodiments, the light blocking layer 6 further includes a second portion 62 covering a portion of the first main surface 11, and a third portion 63 covering at least a portion of the second main surface 12.

On this basis, in some examples, the step S4 of providing the surface of the light blocking layer 6 away from the reflective layer 3 to cover at least the selected side surface 13*a* includes S41 and S42, or includes S401, S402 and S403, or includes S4001, S4002 and S4003.

Please refer to FIGS. 10 to 12 and 16.

In S41, the first portion 61 is attached to the selected side surface 13*a* first.

In S42, the second portion 62 and the third portion 63 are then bent, so that the second portion 62 is attached to the portion of the first main surface 11, and the third portion 63 is attached to at least the portion of the second main surface 12.

In this manufacturing process, the above first alignment mark Q is located on the first portion 61 of the light blocking layer 6, and the second alignment mark Q' is located on the selected side surface 13*a*.

Please refer to FIGS. 10 to 12 and 17.

In S401, the second portion 62 is attached to the portion of the first main surface 11 first.

In S402, the first portion 61 is then attached to the selected side surface 13*a*.

In S403, the third portion 63 is attached to at least the portion of the second main surface 12 finally.

In this manufacturing process, the above first alignment mark Q is located on the second portion 62 of the light blocking layer 6, and the second alignment mark Q' is located on the first main surface 11.

Please refer to FIGS. 10 to 12 and 18.

In S4001, the third portion 63 is attached to at least the portion of the second main surface 12 first.

In S4002, the first portion 61 is then attached to the selected side surface 13*a*.

In S4003, the second portion 62 is attached to the portion of the first main surface 11 finally.

In this manufacturing process, the above first alignment mark Q is located on the third portion 63 of the light blocking layer 6, and the second alignment mark Q' is located on the second main surface 12.

With such the manufacturing process, the third portion 63 of the light blocking layer 6 is in contact with the second main surface 12 of the circuit backplane 1 in a large area. Therefore, it is not easy to fall off or shift when attaching, and accurate attachment may be achieved as long as the material and equipment tolerances are calculated in advance.

In some embodiments, with reference to FIGS. 4 to 10 and 19, before the step of providing the reflective layer 3 covering the selected side surface 13*a*, the method further include S01 and S02.

In S01, a plurality of connection leads 2 are formed on the first main surface 11, the selected side surface 13*a* and the second main surface 12. Each connection lead 2 in the plurality of connection leads 2 extends from the first main surface 11 to the second main surface 12 through the selected side surface 13*a*.

Figure 20:
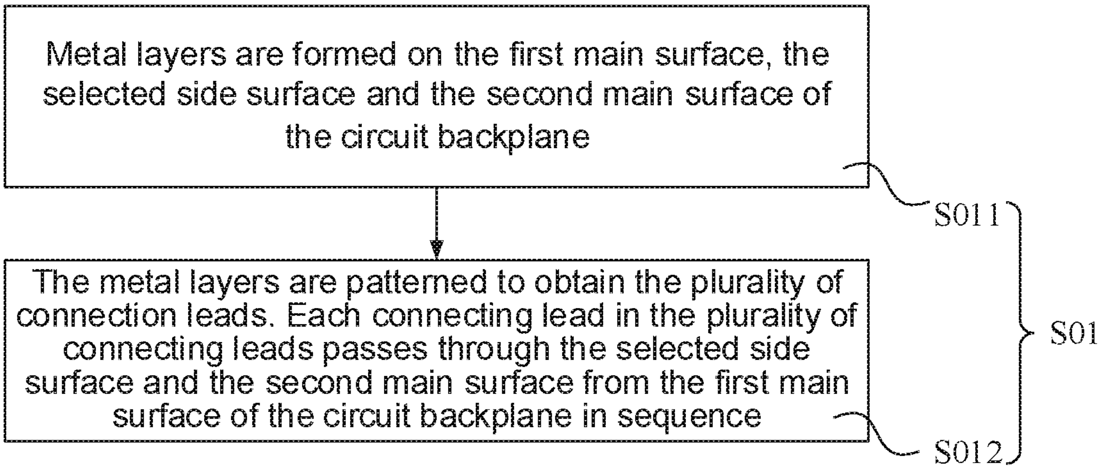
FIG. 20 is a flow diagram of yet another method for manufacturing a display panel, in accordance with some embodiments of the present disclosure.

In this step, the material of the plurality of connection leads 2 may be metal. Based on this, for example, with reference to FIG. 20, the step S01 includes S011 and S012.

In S011, metal layers are formed on the first main surface 11, the selected side surface 13*a* and the second main surface 12 of the circuit backplane.

For example, the metal layers may be deposited by using an electroplating process, an evaporation process, a silver adhesive pad printing process, a sputtering process (e.g., a multi-arc magnetron sputtering process) or the like, so that the metal layers are formed on the first main surface 11, the selected side surface 13*a* and the second main surface 12 of the circuit backplane 1. The above process is used to sequentially deposit a plurality of metal layers, so as to obtain the plurality of stacked metal layers.

In S012, the metal layers are patterned to obtain the plurality of connection leads 2. Each connecting lead 2 in the plurality of connecting leads 2 passes through the selected side surface 13*a* and the second main surface 12 from the first main surface 11 of the circuit backplane 1 in sequence.

In some examples, the metal layers are patterned by using a laser-etching process with high precision to obtain the plurality of connecting leads 2.

Figure 19:
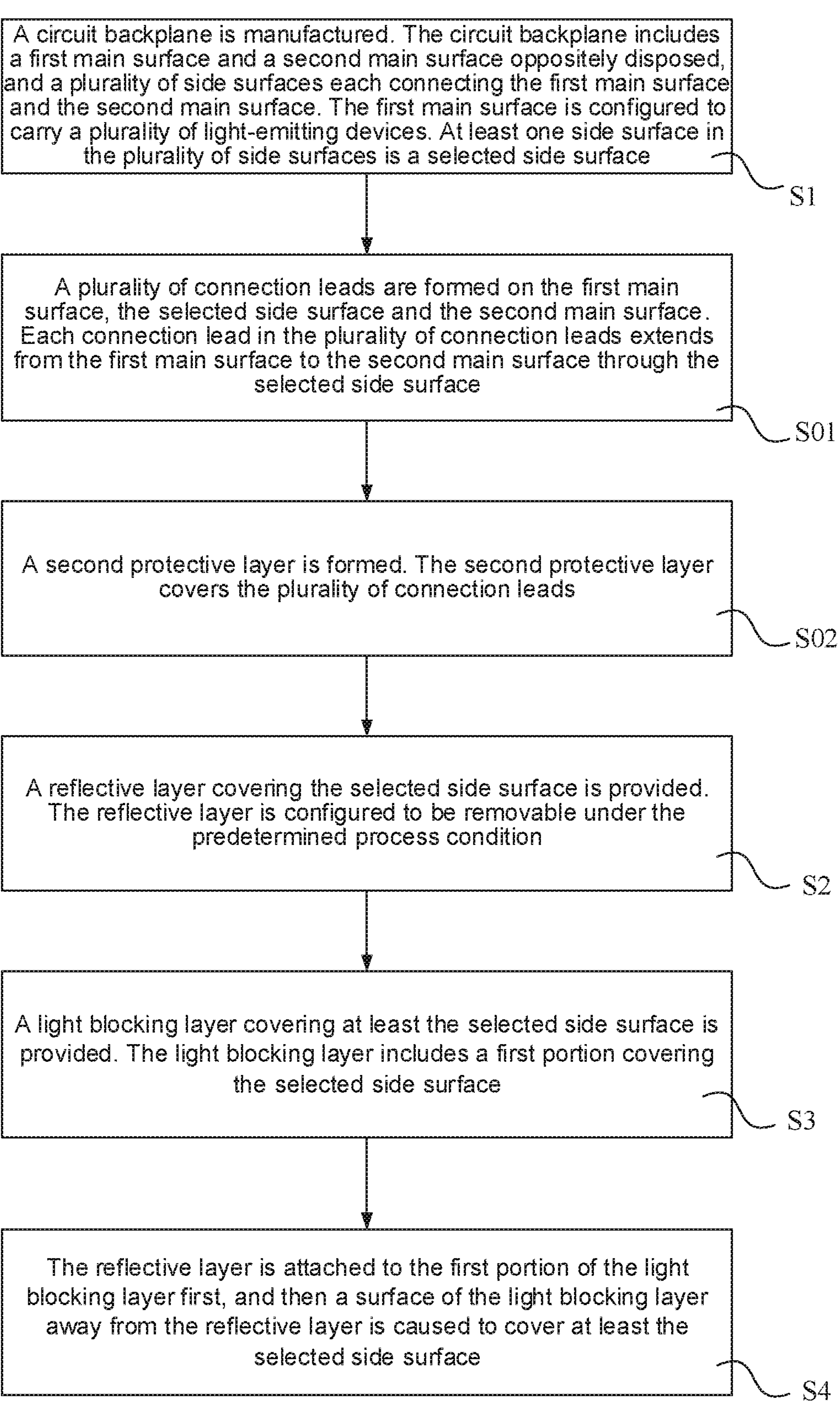
FIG. 19 is a flow diagram of yet another method for manufacturing a display panel, in accordance with some embodiments of the present disclosure.

Continue to refer to FIG. 19 and the structural diagrams FIGS. 7 to 10.

In S02, a second protective layer 5 is formed. The second protective layer 5 covers the plurality of connection leads 2.

The second protective layer 5 is the OC adhesive or an ink layer. In some examples, the second protective layer 5 may be formed by a spraying process, a deposition process or other methods.

For example, the material of the second protective layer 5 is formed, by using a deposition process, on both a side of the plurality of connection leads 2 away from the circuit backplane 1 and a surface of the circuit backplane 1 in gaps between the plurality of connecting leads 2. Thus, the second protective layer 5 as a whole continuously covering the plurality of connecting leads 2, a portion of the first main surface 11, the selected side surface 13*a* and a portion of the second main surface 12 is formed.

Figure 21:
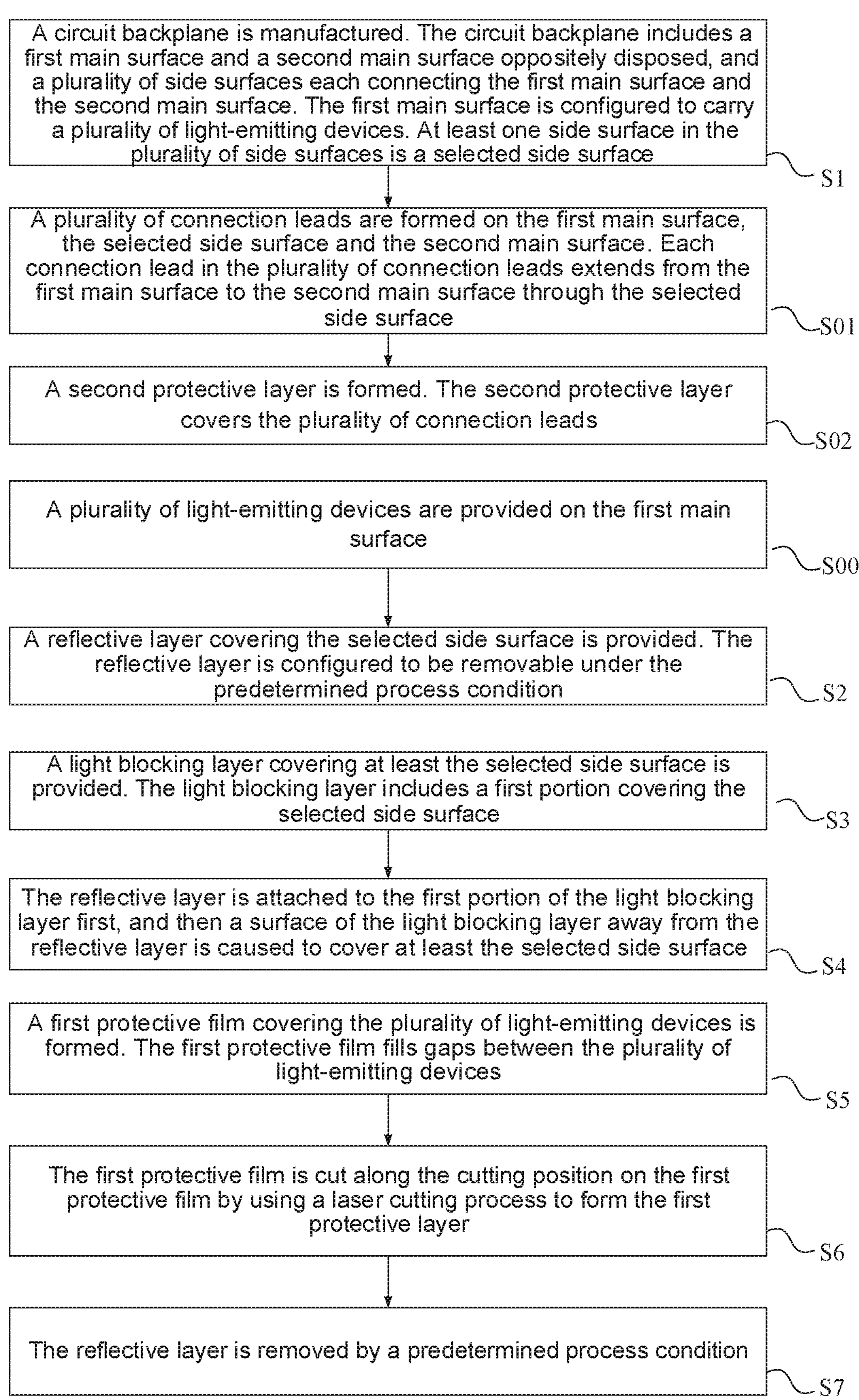
FIG. 21 is a flow diagram of yet another method for manufacturing a display panel, in accordance with some embodiments of the present disclosure.

In some embodiments, referring to FIGS. 13 and 21, the method for manufacturing the display panel further includes S001 and S5 to S7.

In S001, a plurality of light-emitting devices 111 are provided on the first main surface 11.

For example, S001 may be performed between S02 and S2. The plurality of light-emitting devices 111 are used to emit light and display under the control of the circuit backplane.

In S5, a first protective film covering the plurality of light-emitting devices 111 is formed. The first protective film fills gaps between the plurality of light-emitting devices.

In some examples, a pressing process is used to form the first protective film. For example, the pressing process may include a vacuum pressing process.

In S6, the first protective film is cut along the cutting position R on the first protective film by using a laser cutting process to form the first protective layer 7.

In some examples, a picosecond ultraviolet (UV ps) laser is used for laser cutting, so as to ensure cutting accuracy.

In S7, the reflective layer is removed by a predetermined process condition.

The predetermined process condition includes applying at least one of external force, heating and light. The reflective layer 3 is fixed by the adhesion-reducing adhesive layer 31. In this case, in some examples, the adhesion-reducing adhesive layer 31 adopts thermal adhesion-reducing adhesive, and then the above predetermined process condition is heating. By heating the adhesion-reducing adhesive layer 31, the adhesiveness of the adhesion-reducing adhesive layer 31 decreases rapidly, so that the adhesion-reducing adhesive layer 31 and the reflective layer 3 are removed together. In some other examples, the adhesion-reducing adhesive layer 31 adopts UV adhesion-reducing adhesive, and then the above predetermined process condition is light irradiation. By irradiating the adhesion-reducing adhesive layer 31 using ultraviolet rays, the adhesiveness of the adhesion-reducing adhesive layer 31 may decrease rapidly, so that the adhesion-reducing adhesive layer 31 and the reflective layer 3 are removed together.

Figure 22:
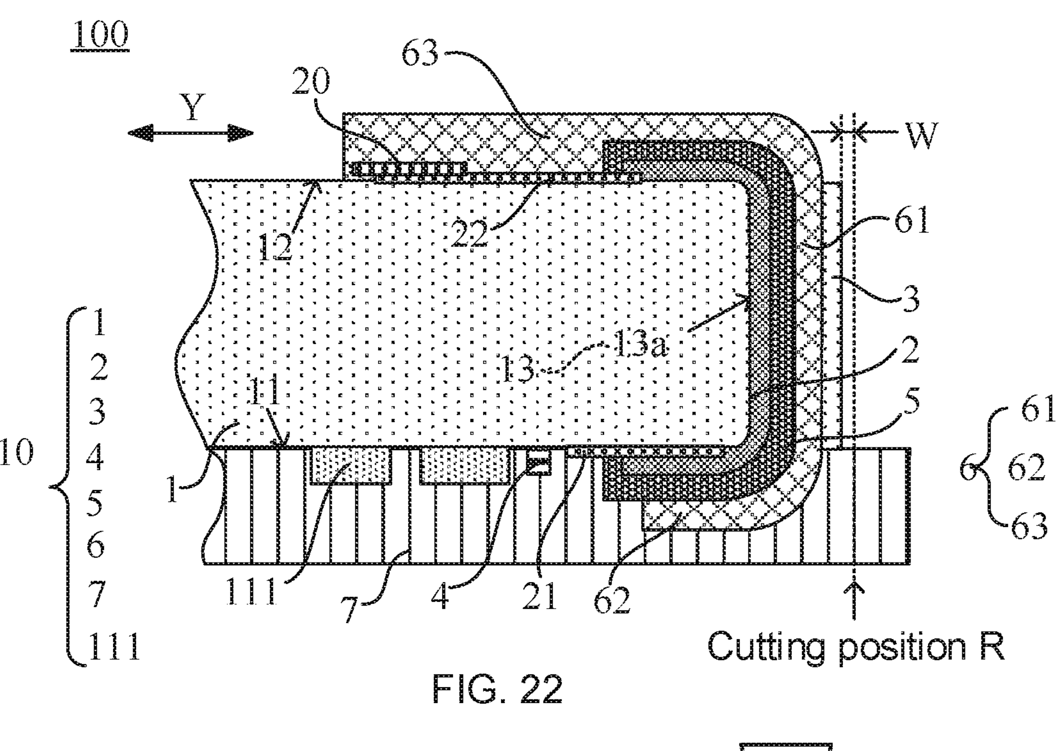
FIG. 22 is a sectional view of a structure of yet another display device, in accordance with some embodiments of the present disclosure.

In some embodiments, with reference to FIG. 22, the cutting position R is located on a side of the reflective layer 3 away from the selected side surface 13*a*, and in a direction perpendicular to the selected side surface 13*a*. The distance between the cutting position R and the reflective layer 3 is a preset value W.

During laser cutting, the heat generated by the laser beam will cause a certain expansion amount of the cutting size. Therefore, when cutting the first protective layer 7, there is a distance of the preset value W between the cutting position R and the outer surface of the reflective layer 3. After cutting, a side surface of the first protective layer 7 may be flush with a surface of the light blocking layer 6 away from the selected side surface 13*a*. In some examples, the preset value W is about 0.2 mm. The term "about" includes the stated value and an average value within an acceptable range of deviation of a specific value, and the acceptable range of deviation is, for example, 25% of 0.2 mm. For example, the preset value W is 0.18 mm, 0.2 mm or 0.22 mm.

In the display panel and the method for manufacturing the display panel, the display device and the tiled display device provided by some embodiments of the present disclosure, the removable reflective layer is provided, so that the taper of the side surface of the front encapsulating film cut by laser may be reduced, thereby reducing the width of the tiled seam. The light blocking layer is provided, and thus it is possible to prevent light leakage from the side surface and the back surface of the display panel, thereby improving the display effect. In addition, the reflective layer and the light blocking layer provided on the side surface of the display panel may further protect the structure on the side surface (e.g., the connection leads), thereby avoiding damage to the structure during the manufacturing.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:

a circuit backplane, including:

a first main surface;

a second main surface disposed opposite to the first main surface; and a plurality of side surfaces each connecting the first main surface and the second main surface, at least one side surface in the plurality of side surfaces being a selected side surface;

a reflective layer covering the selected side surface, and the reflective layer being configured to be removable under a predetermined process condition; and a plurality of connection leads, each connection lead in the plurality of connection leads extending from the first main surface to the second main surface through the selected side surface, wherein the reflective layer covers portions of the plurality of connection leads located on the selected side surface.

2. The display panel according to claim 1, wherein a thickness of the reflective layer is H1, and H1 satisfies a relationship: 5 μm≤H1≤20 μm.

3. The display panel according to claim 1, further comprising an adhesion-reducing adhesive layer, wherein the adhesion-reducing adhesive layer is disposed on a surface of the reflective layer proximate to the selected side surface.

4. The display panel according to claim 1, further comprising:

a second protective layer covering the plurality of connecting leads and filling gaps between the plurality of connecting leads.

5. A display device, comprising:

the display panel according to claim 1; and a driving circuit board located on a side where the second main surface of the circuit backplane is located; and the driving circuit board being coupled to the circuit backplane through a plurality of connection leads.

6. A tiled display device, comprising:

a plurality of display devices that are tiled and each according to claim 5.

7. The display panel according to claim 1, further comprising:

a light blocking layer disposed on a side of the reflective layer proximate to the selected side surface, wherein the light blocking layer includes a first portion, and the first portion is located on the selected side surface and covers the portions of the plurality of connection leads located on the selected side surface.

8. The display panel according to claim 7, wherein the light blocking layer further includes a second portion, and the second portion covers a portion of the first main surface; or the light blocking layer further includes a second portion, and the second portion covers a portion of the first main surface; a direction perpendicular to a boundary line connecting the first main surface to the selected side surface and parallel to the first main surface is a first direction; a length of the second portion in the first direction is a, and a satisfies a relationship: 50 μm≤a≤300 μm.

9. The display panel according to claim 7, wherein the light blocking layer further includes a second portion and a third portion, the second portion covers a portion of the first main surface, and the third portion is disposed at an end of the first portion away from the second portion, and the third portion covers at least a portion of the second main surface; or the light blocking layer further includes a second portion and a third portion, the second portion covers a portion of the first main surface, and the third portion is disposed at an end of the first portion away from the second portion and covers at least a portion of the second main surface; a direction perpendicular to a boundary line connecting the first main surface to the selected side surface and parallel to the first main surface is a first direction; a dimension of the third portion in the first direction is b, a dimension of the circuit backplane in the first direction is c, and b and c satisfy a relationship: 20 μm≤b≤c.

10. The display panel according to claim 7, wherein an optical density value OD of the light blocking layer satisfies a relationship: OD≥2; and/or a material of the light blocking layer includes at least one of thermoplastic polyurethane elastomer rubber and polyimide; and/or a thickness of the light blocking layer is H2, and H2 satisfies a relationship: 10 μm≤H2≤100 μm.

11. The display panel according to claim 7, further comprising:

a plurality of light-emitting devices located on the first main surface; and a first protective layer located on the first main surface; the first protective layer covering the plurality of light-emitting devices and filling gaps between the plurality of light-emitting devices; or the display panel further comprising:

a plurality of light-emitting devices located on the first main surface; and a first protective layer located on the first main surface; the first protective layer covering the plurality of light-emitting devices and filling gaps between the plurality of light-emitting devices, wherein a side surface of the first protective layer proximate to the selected side surface is substantially flush with a side surface of the light blocking layer away from the selected side surface.

12. The display panel according to claim 7, wherein the light blocking layer is provided with a first alignment mark therein, and the circuit backplane is provided with a second alignment mark aligned with the first alignment mark.

13. The display panel according to claim 12, wherein the light blocking layer further includes a second portion and a third portion; the second portion covers a portion of the first main surface, and the third portion is disposed at an end of the first portion away from the second portion, and the third portion covers at least a portion of the second main surface; and the first alignment mark is located in at least one of the first portion, the second portion and the third portion of the light blocking layer.

14. The display panel according to claim 13, wherein the first alignment mark includes at least two alignment holes, and the alignment holes are each any of a circular hole, a T-shaped hole or a cross hole.

15. A method for manufacturing a display panel, comprising:

manufacturing a circuit backplane; the circuit backplane including a first main surface and a second main surface that are oppositely disposed, and a plurality of side surfaces each connecting the first main surface and the second main surface; the first main surface being configured to carry a plurality of light-emitting devices; at least one side surface in the plurality of side surfaces is a selected side surface;

forming a plurality of connection leads on the first main surface, the selected side surface and the second main surface; each connection lead in the plurality of connection leads extending from the first main surface to the second main surface through the selected side surface; and forming a second protective layer; the second protective layer covering the plurality of connection leads; and providing a reflective layer covering the selected side surface; the reflective layer being configured to be removable under a predetermined process condition.

16. The method for manufacturing the display panel according to claim 15, further comprising:

providing a light blocking layer covering at least the selected side surface; the light blocking layer including a first portion covering the selected side surface, wherein providing the reflective layer covering the selected side surface and providing the light blocking layer covering at least the selected side surface, include:

attaching the reflective layer to the first portion of the light blocking layer first, and then making a surface of the light blocking layer away from the reflective layer cover at least the selected side surface.

17. The method for manufacturing the display panel according to claim 15, further comprising:

forming the plurality of light-emitting devices on the first main surface;

forming a first protective layer covering the plurality of light-emitting devices and filling gaps between the plurality of light-emitting devices; and removing the reflective layer by the predetermined process condition, the predetermined process condition including at least one of application of external force, heating and light.

18. A display panel, comprising:

a circuit backplane, including:

a first main surface;

a second main surface disposed opposite to the first main surface; and a plurality of side surfaces each connecting the first main surface and the second main surface, at least one side surface in the plurality of side surfaces being a selected side surface;

a reflective layer covering the selected side surface, and the reflective layer being configured to be removable under a predetermined process condition; and an adhesion-reducing adhesive layer being disposed on a surface of the reflective layer proximate to the selected side surface.

19. The display panel according to claim 18, wherein adhesiveness strength of the adhesion-reducing adhesive layer is S, and S satisfies a relationship: 5 gf/25 mm≤S≤10 gf/25 mm; and/or the adhesion-reducing adhesive layer includes thermal adhesion-reducing adhesive or ultraviolet adhesion-reducing adhesive.

* * * * *